US007426681B2

(12) United States Patent
Yamamoto

(10) Patent No.: US 7,426,681 B2
(45) Date of Patent: Sep. 16, 2008

(54) VITERBI DETECTOR

(75) Inventor: Akira Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 519 days.

(21) Appl. No.: 10/146,902

(22) Filed: May 17, 2002

(65) Prior Publication Data

US 2002/0174402 A1 Nov. 21, 2002

(30) Foreign Application Priority Data

May 18, 2001 (JP) ............................. 2001-148806

(51) Int. Cl.
*H03M 13/03* (2006.01)
(52) U.S. Cl. .................. 714/794; 714/795; 714/796
(58) Field of Classification Search ................ 714/794, 714/792, 793, 795, 797, 796; 375/341; 708/205
See application file for complete search history.

(56) References Cited

U.S. PATENT DOCUMENTS

| | | | | |
|---|---|---|---|---|
| 4,777,636 A | * | 10/1988 | Yamashita et al. | .......... 714/795 |
| 5,295,142 A | * | 3/1994 | Hatakeyama | ................ 714/794 |
| 5,566,191 A | * | 10/1996 | Ohnishi et al. | ............. 714/794 |
| 5,715,470 A | * | 2/1998 | Asano et al. | ................ 375/341 |
| 5,796,756 A | | 8/1998 | Choi et al. | |
| 5,838,697 A | * | 11/1998 | Abe | ............................ 714/796 |
| 5,940,416 A | * | 8/1999 | Nishiya et al. | ............. 714/795 |
| 5,983,383 A | * | 11/1999 | Wolf | .......................... 714/755 |
| 6,215,831 B1 | * | 4/2001 | Nowack et al. | ............. 375/340 |
| 6,324,226 B1 | * | 11/2001 | Sasagawa | .................... 375/341 |
| 6,651,215 B2 | * | 11/2003 | Miyauchi et al. | ........... 714/795 |
| 6,748,034 B2 | * | 6/2004 | Hattori et al. | ............... 375/341 |

FOREIGN PATENT DOCUMENTS

| | | |
|---|---|---|
| JP | 05037402 | 2/1993 |
| JP | 08037466 | 2/1996 |
| JP | 08180608 | 7/1996 |
| JP | 09247002 | 9/1997 |

\* cited by examiner

*Primary Examiner*—Mujtaba Chaudry
(74) *Attorney, Agent, or Firm*—McDermott Will & Emery LLP

(57) ABSTRACT

A path-select-signal memory section in the Viterbi detector outputs each decoded data $B'^{Si}_k$ corresponding to a branch that occurred a prescribed time ago in a surviving path to each state at a present time, in response to path select signals SEL0, SEL1. A shift register stores the path select signals SEL0, SEL1 in order of time. A binary output unit outputs a decoded bit corresponding to a branch that occurred a prescribed time ago in a surviving path. Output signal lines of the binary output unit and a selector train are connected according to a trellis diagram that corresponds to encoding operation.

12 Claims, 13 Drawing Sheets

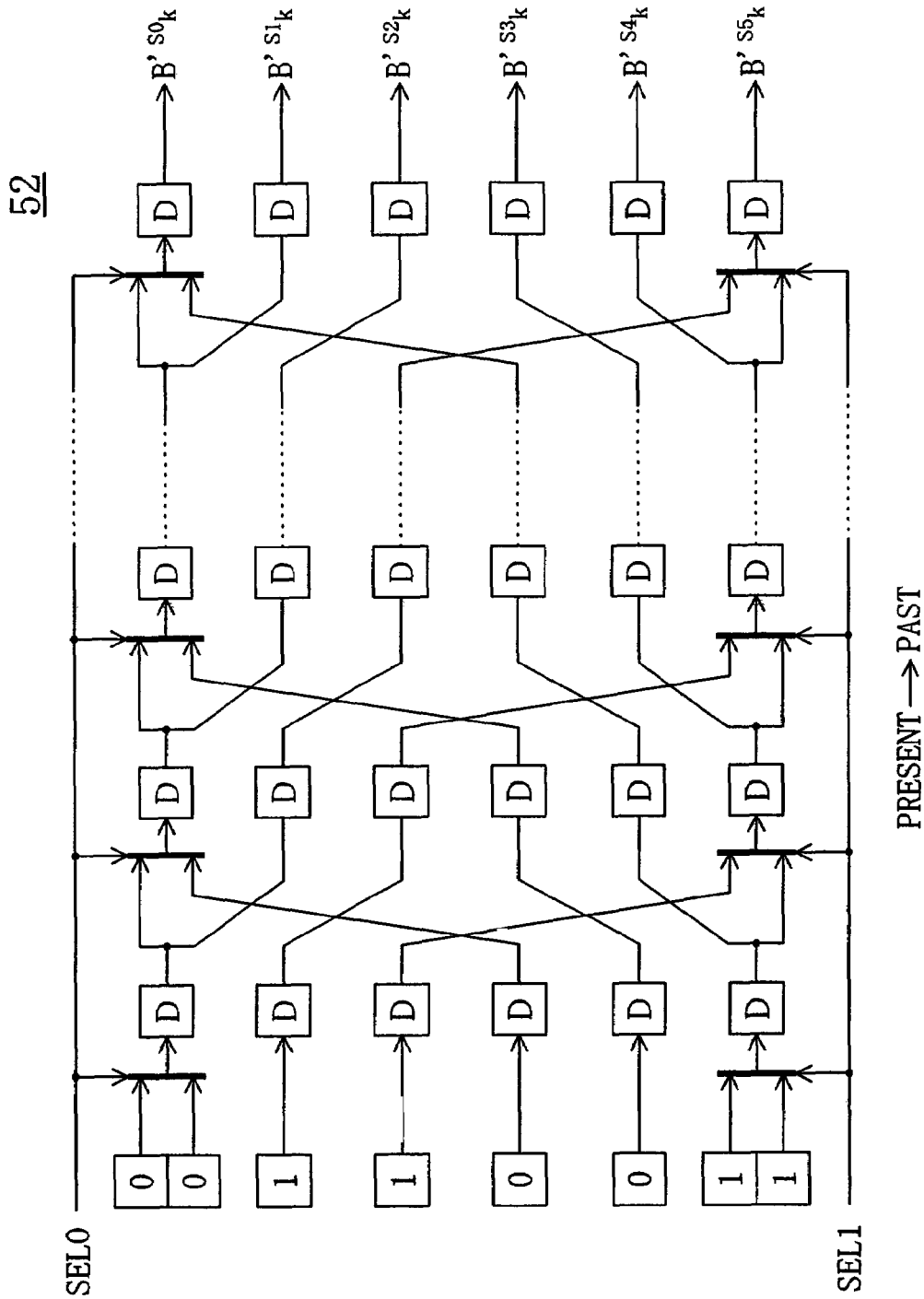
PRIOR ART FIG. 11

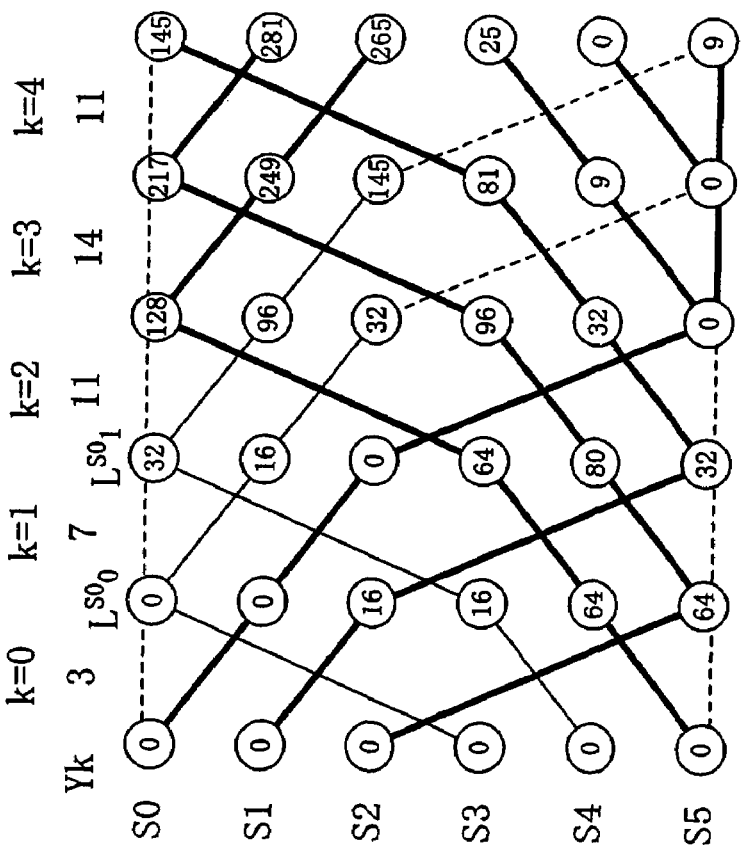
PRIOR ART FIG. 12A
PRIOR ART FIG. 12B

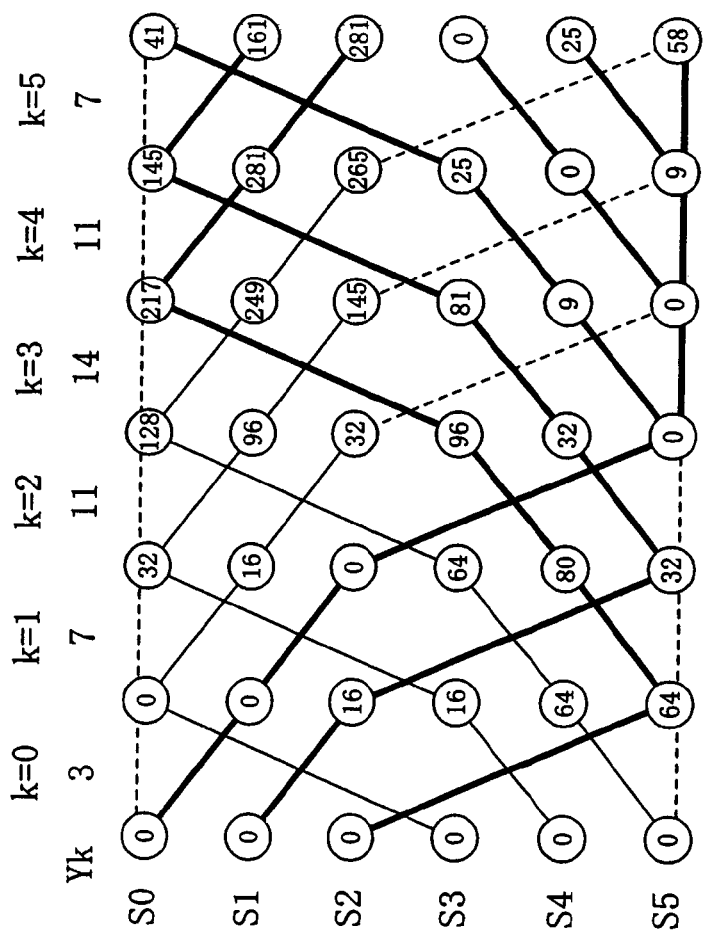
PRIOR ART FIG. 13A
PRIOR ART FIG. 13B

VITERBI DETECTOR

BACKGROUND OF THE INVENTION

The present invention relates to a Viterbi detector for maximum-likelihood decoding of a reproduced signal from a recording medium such as a magnetic disk, a magneto-optical disk and an optical disk.

Recently, recording media such as CD (Compact Disk) and DVD (Digital Versatile Disk) have attracted attention because of their ability to semi-permanently store the recorded data. Encoding technology such as EFM (Eight to Fourteen Modulation) and 8/16 modulation as well as signal processing technology called PRML (Partial Response Maximum Likelihood) are used to improve the data recording density and data reproducing capability of the CD and DVD.

FIG. 6 schematically shows a PRML-based DVD recording/reproducing system. For convenience, it is herein assumed that the system of FIG. 6 uses PR (Partial Response) (3, 4, 4, 3).

Referring to FIG. 6, an 8/16 modulator 1 modulates 8-bit original input data into a 16-bit modulation code defined by a modulation table. A basic modulation rule is that the number of successive zeros ("0") between code bits "1" and "1" is in the range of two to ten. This rule is commonly called (2, 10) RLL (Run Length Limited). A channel bit pulse train Ak resulting from NRZI (Non Return to Zero Inverted) conversion of the modulation code string is recorded on a disk 2. Provided that a channel bit width is T, the shortest pulse width of the recorded channel bit pulse train Ak is 3T and the longest pulse width is 11T according to the above modulation rule.

An optical pickup 3 reads a channel bit pulse train Bk from the disk 2 for output to an analog filter 3 as an analog reproduced signal. The analog filter 4 filters out a high frequency component from the received analog reproduced signal, and controls a signal component of a specific frequency band toward frequency characteristics of PR (3, 4, 4, 3).

The analog reproduced signal thus filtered by the analog filter 4 is applied to an analog-digital (A-D) converter 5. The A-D converter 5 converts the received analog reproduced signal into a digital signal for output to an FIR (Finite Impulse Response) filter 6, where the digital signal is further equalized toward the frequency characteristics of PR (3, 4, 4, 3). A PR (3, 4, 4, 3)-type Viterbi detector 7 receives the equalized digital signal Yk for decoding into binary reproduced data B'k. Note that, although not shown in the figure, a clock signal used in sampling in the A-D converter 5 and operation of the digital circuitry in the subsequent stage (FIR 6 and Viterbi detector 7) is produced by a frequency comparator, a phase comparator and a voltage-controlled oscillator based on the analog reproduced signal.

Hereinafter, the Viterbi detector will be described.

The Viterbi detector is known as a maximum-likelihood decoder of a convolutional code. In the system of FIG. 6, the process of obtaining the digital filter output Yk from the channel bit pulse train Bk recorded on the disk 2 can be regarded as convolutional encoding operation. As shown in FIG. 7, this convolutional encoding operation can be represented using three delay elements 20a, 20b, 20c and four multiplying elements 21a, 21b, 21c, 21d (constraint length K=4). Yk may have nine values (0, 3, 4, 6, 7, 8, 10, 11, 14) based on combination of the values Bk.

The operation conducted by the Viterbi detector 7 of FIG. 6 is opposite to the encoding operation of FIG. 7. In other words, the Viterbi detector 7 decodes the most likely channel bit pulse train, that is, reproduced data B'k, based on the states of the delay elements 20a, 20b, 20c, or combination of the states of the delay elements 20a, 20b, 20c and the digital filter output Yk.

The three delay elements 20a, 20b, 20c of FIG. 7 may have eight states (0, 0, 0), (0, 0, 1), (0, 1, 0), (0, 1, 1), (1, 0, 0), (1, 0, 1), (1, 1, 0) and (1, 1, 1). In view of the fact that the shortest pulse width is 3T, the states (0, 1, 0), (1, 0, 1) are impossible. Therefore, the three delay elements 20a, 20b, 20c may have six states. In this case, the digital filter output Yk may have five values (0, 4, 7, 11, 14).

The six states are herein defined as follows:

S0=(0, 0, 0);
S1=(1, 0, 0);
S2=(1, 1, 0);
S3=(0, 0, 1);
S4=(0, 1, 1); and
S5=(1, 1, 1).

In this case, the channel bit pulse train Bk and the digital filter output Yk transition with time according to the state transition diagram of FIG. 8. More specifically, there are transitions from S0 to S0, S0 to S1, S1 to S2, S2 to S5, S5 to S5, S5 to S4, S4 to S3, and S3 to S0. FIG. 9 is a trellis diagram based on the state transition of FIG. 8.

FIG. 10 shows an example of the Viterbi detector 7 for decoding the reproduced data based on the state transition of FIG. 8. The Viterbi detector 7 of FIG. 10 includes a branch metric calculating section 50, an ACS (Add-Compare-Select) operation section 51, a path memory 52 and a maximum-likelihood determination section 53.

The branch metric calculating section 50 calculates branch metrics from each state to each state. A branch metric corresponds to the likelihood of transition from a certain state to a certain state. It is herein assumed that a smaller branch metric indicates a stronger likelihood. Each branch metric A, B, C, D, E can be calculated by the following equations:

$A=(Yk-14)^2;$ $B=(Yk-11)^2;$ $C=(Yk-7)^2;$ $D=(Yk-3)^2;$ and $E=(Yk-0)^2.$

Herein, A is a branch metric from S5 to S5, B is a branch metric from S2 to S5 and from S5 to S4, C is a branch metric from S1 to S2 and from S4 to S3, D is a branch metric from S0 to S1 and from S3 to S0, and E is a branch metric from S0 to S0.

For example, when the Viterbi detector 7 receives Yk=0, it is determined that the most likely state transition is from S0 to S0. Therefore, the above equations can be rewritten as follows:

$A=(0-14)^2=196;$ $B=(0-11)^2=121;$ $C=(0-7)^2=49;$ $D=(0-3)^2=9;$ and $E=(0-0)^2=0.$ In this case, E has the smallest value. These branch metrics A to E are applied to the ACS operation section 51.

The ACS operation section 51 adds each branch metric and a corresponding path metric in the previous state, and conducts comparison and selection operations. For example, according to the state transition in the trellis diagram of FIG. 9, there are two ways to get to the present state S0: from the previous state S0; and from the previous state S3. The ACS operation section 51 calculates the sum of a path metric $L^{S0}_{k-1}$ (the sum of the branch metrics from a certain point in the past to the previous state S0) and the current branch metric E, and the sum of a path metric $L^{S3}_{k-1}$ (the sum of the branch metrics from a certain point in the past to the previous state S3) and the current branch metric D.

The ACS operation section 51 then compares the sums ($L^{S0}_{k-1}+E$) and ($L^{S3}_{k-1}+D$) with each other, and selects the smaller (i.e., more likely) one as a path metric of a surviving path. The ACS operation section 51 thus obtains a path metric $L^{S0}_{k}$ in the present state S0, and outputs a path select signal SEL0 to the path memory 52. The path select signal SEL0 is set to "1" when ($L^{S0}_{k-1}+E$) is smaller than ($L^{S3}_{k-1}+D$), and set to "0" when ($L^{S0}_{k-1}+E$) is larger than ($L^{S3}_{k-1}+D$). In other words, SEL0=1 indicates that the transition from the previous state S0 to the present state S0 was selected as a surviving path, and SEL0=0 indicates that the transition from the previous state S3 to the present state S0 was selected as a surviving path.

There is only one way to get to the present state S1: from the previous state S0. Therefore, the ACS operation section 51 calculates the sum of a path metric $L^{S0}_{k-1}$ and the current branch metric D as a path metric $L^{S1}_{k}$ in the present state S1. In other words, the ACS operation section 51 does not conduct comparison and selection operations.

For the states S2, S3, S4, S5 as well, the ACS operation section 51 similarly calculates path metrics $L^{S2}_{k}$, $L^{S3}_{k}$, $L^{S4}_{k}$, $L^{S5}_{k}$ in the present state. Regarding the path metric in the present state S5, the ACS operation section 51 outputs a path select signal SEL1 to the path memory 52.

The above operation of the ACS operation section 51 can be represented by the following equations:

$L^{S0}_{k}=\min[L^{S0}_{k-1}+E, L^{S3}_{k-1}+D];$ $L^{S1}_{k}=L^{S0}_{k-1}+D;$ $L^{S2}_{k}=L^{S1}_{k-1}+C;$ $L^{S3}_{k}=L^{S4}_{k-1}+C;$ $L^{S4}_{k}=L^{S5}_{k-1}+B;$ $L^{S5}_{k}=\min[L^{S2}_{k-1}+B, L^{S5}_{k-1}+A];$ SEL0=1 (for $L^{S0}_{k-1}+E<L^{S3}_{k-1}+D$);

SEL0=0 (for $L^{S0}_{k-1}+E.L^{S3}_{k-1}+D$);

SEL1=1 (for $L^{S2}_{k-1}+B<L^{S5}_{k-1}+A$); and

SEL1=0 (for $L^{S2}_{k-1}+E.L^{S5}_{k-1}+A$).

The path memory 52 is a circuit that receives the path select signals SEL0, SEL1 from the ACS operation section 51 and outputs decoded data corresponding to the least recent branch of a surviving path to each state. This operation will now be described with reference to FIGS. 11 to 13B.

FIG. 11 specifically shows the circuit structure of the path memory 52. The path memory 52 of FIG. 11 has registers D arranged in a matrix. Each of the registers D in each row stores the decoded bits corresponding to a surviving path to the respective state.

FIG. 12A shows path metrics at each time and surviving paths at time k=4. It is assumed in FIG. 12A that the Viterbi detector 7 received Yk=(3, 7, 11, 14, 11). A figure(s) in each circle indicates a path metric in a corresponding state at corresponding time. For example, a path metric $L^{S0}_{0}$ in the state S0 at time k=0 is "0" and a path metric $L^{S0}_{1}$ in the state S0 at time k=1 is "32". Dashed lines in the figure represent the branches that were not selected by the ACS operation section 51. Thin solid lines represent the paths that were not able to be a surviving path at time k=4, and thick solid lines represent the surviving paths in the respective states at time k=4.

FIG. 12B shows decoded bits corresponding to a surviving path to each state at time k=4. For example, a surviving path to the state S0 at time k=4 is S1→S2→S5→S4→S3→S0. Referring to the state transition diagram of FIG. 8, a decoded bit "1" is obtained by the state transition from S1 to S2. Similarly, a decoded bit "1" is obtained by the state transition from S2 to S5, a decoded bit "0" by the state transition from S5 to S4, a decoded bit "0" by the state transition from S4 to S3, and a decoded bit "0" by the state transition from S3 to S0. Therefore, the decoded bits "11000" correspond to the surviving path to the state S0 at time k=4. The decoded bits corresponding to the surviving paths to the states S1, S2, S3, S4, S5 can be similarly obtained as "10001", "00011", "11100", "11110" and "11111".

FIG. 13A shows path metrics at each time and surviving paths at time k=5. It is assumed in FIG. 13A that the Viterbi detector 7 received Y5=7, that is, Yk=(3, 7, 11, 14, 11, 7). FIG. 13B shows decoded bits corresponding to a surviving path to each state at time k=5.

In the illustrated example, there are two ways to get to the state S0 at time k=5: from the state S0 at time k=4; and from the state S3 at time k=4. The ACS operation section 51 compares the corresponding path metrics, and selects the path from the state S3. Accordingly, the decoded bits corresponding to the surviving path to the state S0 at time k=5 are "111000", that is, the decoded bits "11100" corresponding to the surviving path to the state S3 at time k=4 plus the decoded bit "0" obtained by the state transition from S3 to S0. For the other states as well, the decoded bit sequences corresponding to the surviving paths to the respective states are similarly obtained by adding a corresponding decoded bit.

The path memory 52 of FIG. 11 conducts the above processing. Note that, in the example of FIG. 11, the registers in the leftmost column respectively store the present decoded bits, and the registers in the rightmost column respectively store the least recent decoded bits, as opposed to the case of FIGS. 12 and 13. It is impossible to implement an infinite path memory length (an infinite number of registers in each row) in the circuitry. In other words, the path memory length has a certain finite value. The path memory 52 therefore outputs the least recent decoded bits in the finite time to the maximum-likelihood determination section 53 as temporary decoded bits $B'^{S0}_{k}$, $B'^{S1}_{k}$, $B'^{S2}_{k}$, $B'^{S3}_{k}$, $B'^{S4}_{k}$, $B'^{S5}_{k}$.

The maximum-likelihood determination section 53 compares the present path metrics of the respective states with each other, and outputs a temporary decoded bit of the state corresponding to the smallest path metric as a decoded bit B'k of the Viterbi detector 7. The maximum-likelihood decoding is originally conducted in this way.

In view of the costs required for comparison between the path metrics of the respective states, maximum-likelihood decoding is sometimes conducted according to the majority logic. More specifically, the number of ones ("1") in the temporary decoded bits of the respective states is compared with the number of zeros ("0") therein, and the larger one ("1" or "0") is output as a decoded bit. In order to further reduce such operation costs, any one of the states may be selected for output as a decoded bit. Of these three methods (original maximum-likelihood decoding, majority logic, and selection of any one of the states), the original maximum-likelihood decoding has the best likelihood, followed by the majority logic and the selection of any one of the state. However, such difference in likelihood often does not cause any practical disadvantage as long as the path memory length is long enough for the Viterbi input signal Yk.

The Viterbi detector having the above structure includes a vast number of registers in the path memory section. This hinders reduction in power consumption and area of the Viterbi detector.

For example, when the above recorded channel bits having the shortest pulse width 3T are equalized by the PR (3, 4, 4, 3) method, the Viterbi detector has six states. Provided that the length for storing the decoded bits corresponding to a surviving path to a certain state, that is, the path memory length, is 40, the Viterbi detector must have 240 (=6 (states)×40 (path memory length)) registers.

In general, the registers consume a larger amount of power and occupy a larger area as compared to the normal logic circuitry. Therefore, reduction in the number of registers is required in order to implement reduction in power consumption and area of the Viterbi detector.

SUMMARY OF THE INVENTION

It is an object of the present invention to provide a Viterbi detector having a simplified circuit structure with reduced power consumption and circuit area as compared to a conventional example.

More specifically, according to the present invention, a Viterbi detector for maximum-likelihood decoding of a convolutionally-encoded input signal includes: a branch metric calculating section for calculating branch metrics from the input signal; an ACS (Add-Compare-Select) operation section for calculating a path metric in each state at a present time by ACS operation using both a path metric at a previous time in a surviving path to that state and the corresponding branch metric calculated by the branch metric calculating section, and outputting a path select signal corresponding to a metric selected by the ACS operation; a path-select-signal memory section responsive to the path select signal, for outputting decoded data corresponding to a branch that occurred a prescribed time ago in a surviving path to each state at a present time; and a maximum-likelihood determination section for determining most likely decoded data from each decoded data received from the path-select-signal memory section. The path-select-signal memory section includes a shift register for storing the path select signals in order of time, a selector train formed from a plurality of selectors for receiving values stored in respective registers of the shift register as a select signal, and a binary output unit for outputting a decoded bit corresponding to a branch that occurred a prescribed time ago in a surviving path. Output signal lines of the binary output unit and the selector train are connected according to a trellis diagram that corresponds to encoding operation of the input signal.

According to the present invention, the path select signals are stored in the shift register. This enables significant reduction in the number of registers in the Viterbi detector, and thus enables reduction in power consumption and area of the Viterbi detector.

BRIEF DESCRIPTION OF THE DRAWINGS

FIG. 11 specifically shows the circuit structure of a conventional path memory;

FIG. 12A shows path metrics at each time and surviving paths at time k=4 for Yk=(3, 7, 11, 14, 11), and FIG. 12B shows encoded bit strings for the respective surviving paths; and FIG. 13A shows path metrics at each time and surviving paths at time k=5 for Yk=(3, 7, 11, 14, 11, 7), and FIG. 13B shows encoded bit strings of the respective surviving paths.

DETAILED DESCRIPTION OF THE INVENTION

Figure 1:
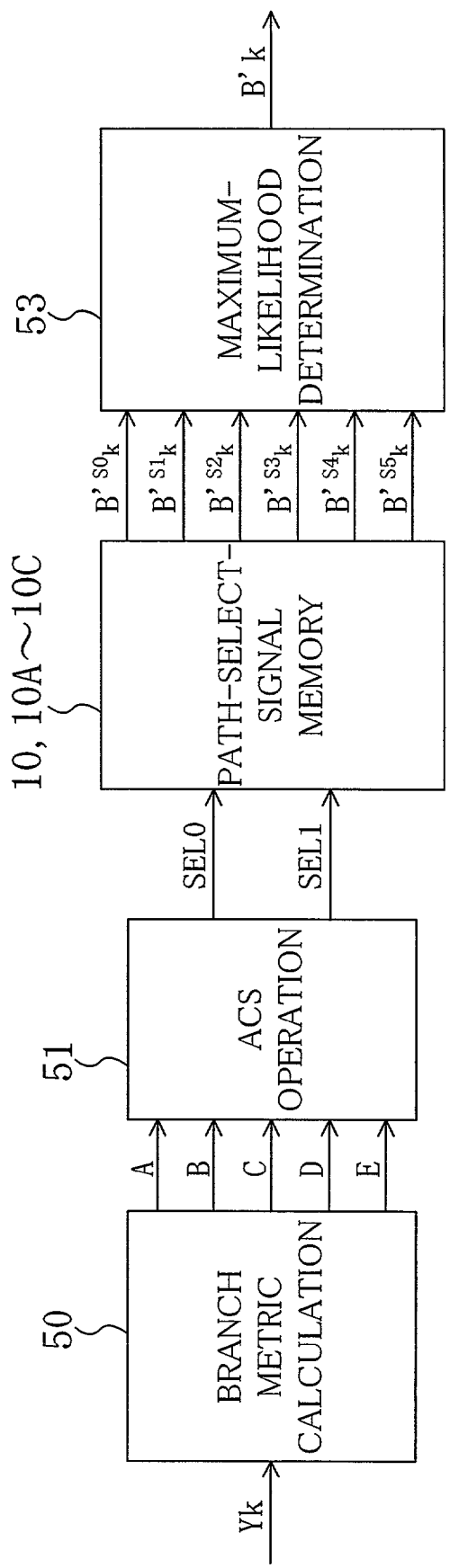
FIG. 1 is a block diagram of an example of a Viterbi detector according to an embodiment of the present invention.
Figure 10:
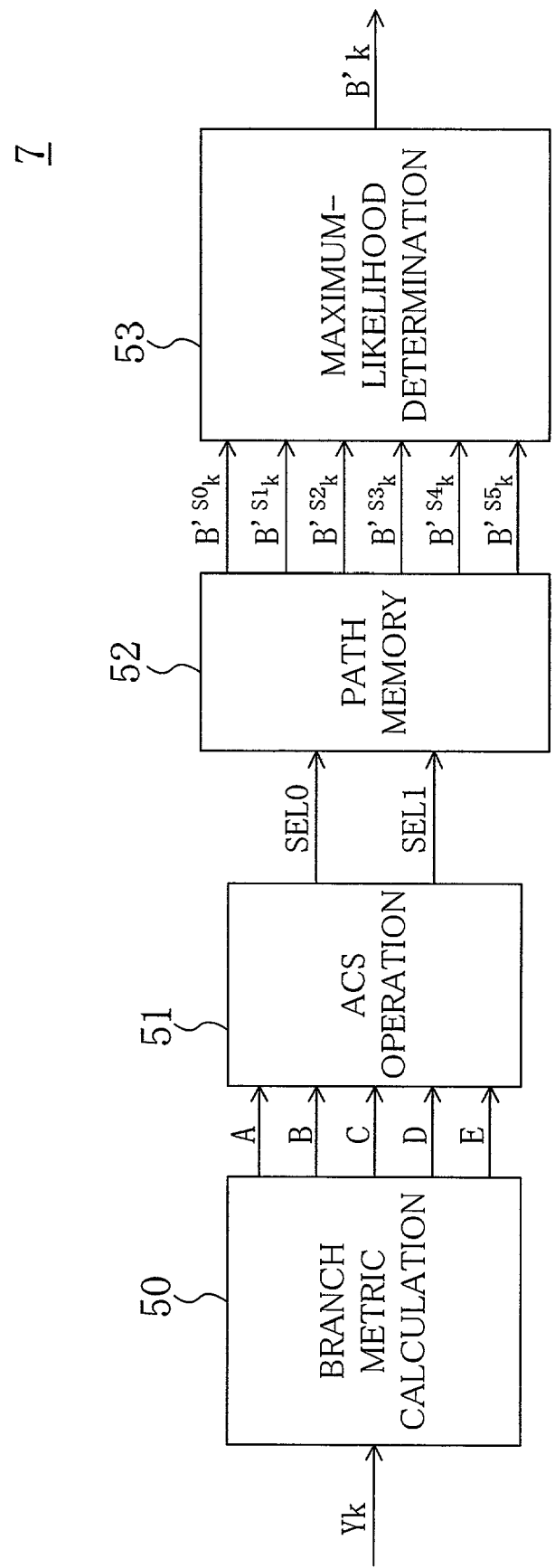
FIG. 10 is a block diagram of an example of a conventional Viterbi detector.

FIG. 1 is a block diagram of the structure of a Viterbi detector according to an embodiment of the present invention. In FIG. 1, the same components as those of the conventional Viterbi detector in FIG. 10 are denoted with the same reference numerals and characters. Like the Viterbi detector of FIG. 10, the Viterbi detector of FIG. 1 includes a branch metric calculating section 50, an ACS operation section 51 and a maximum-likelihood determination section 53. However, the Viterbi detector of FIG. 1 is different from that of FIG. 10 in that the Viterbi detector of FIG. 1 includes a path-select-signal memory section 10 instead of the path memory 52. The path-select-signal memory section 10 is a block for decoding a bit $B'^{Si}_k$ (i=0 to 5) that was obtained a prescribed time ago in a surviving path to each state, in response to path select signals SEL0, SEL1. The present invention is characterized by the path-select-signal memory section 10.

Figure 8:
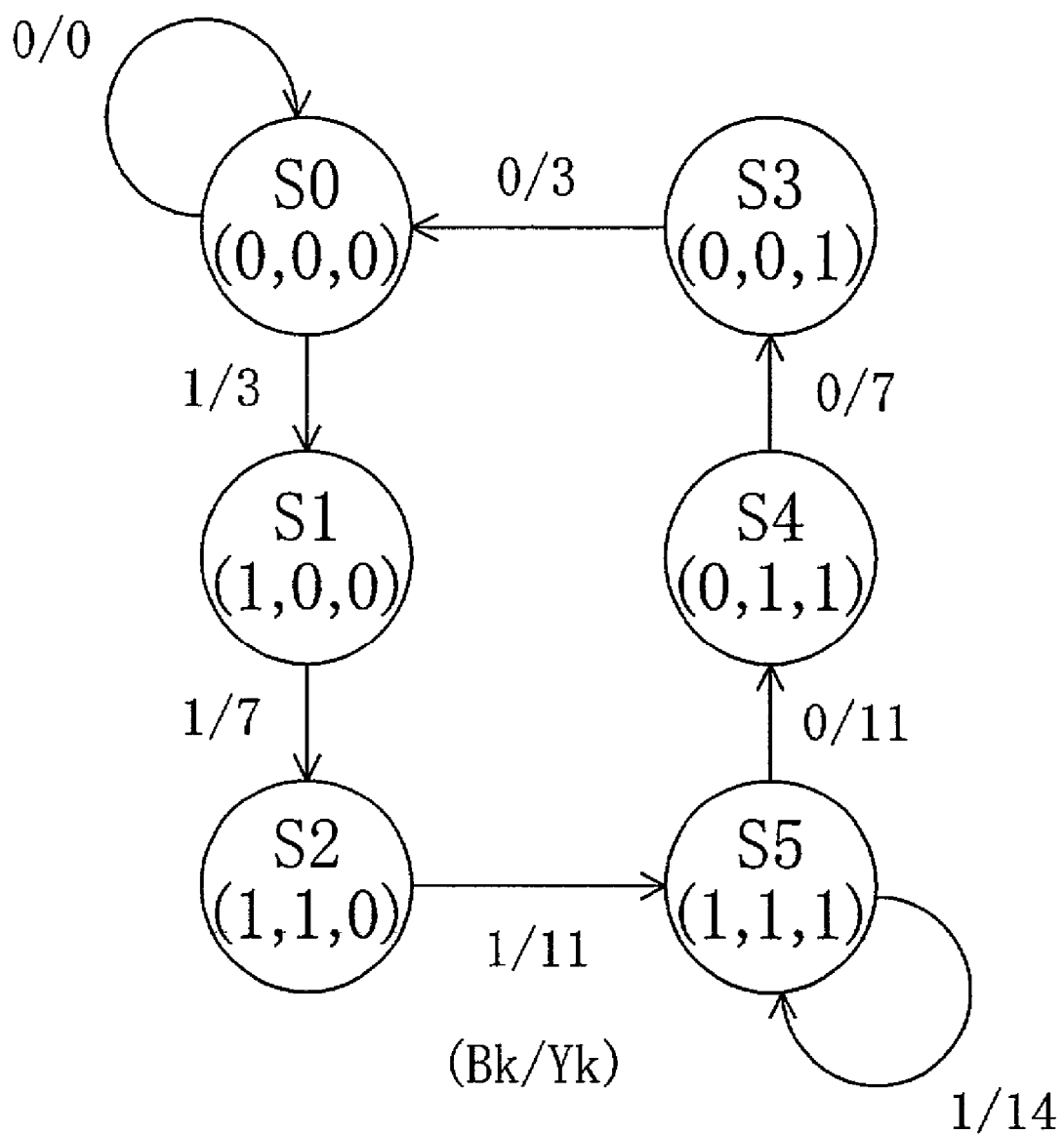
FIG. 8 shows state transition of the Viterbi detector.

Note that, like the Viterbi detector of FIG. 10, the Viterbi detector of FIG. 1 conducts Viterbi decoding of the state transition of FIG. 8. As described in the "BACKGROUND OF THE INVENTION", the Viterbi detector of the present embodiment is used in, e.g., a magnetic disk reproducing device and an optical disk reproducing device. For example, an input signal Yk may be one of the following signals: a signal produced from the data whose shortest pulse width is limited to a value equal to or larger than two channel bits; a signal produced by PR-equalizing the data whose shortest pulse width is limited to a value equal to or larger than two channel bits; a signal produced by NRZI-converting an RLL (2, 10)-encoded signal and then equalizing the resultant signal by PR (a, b, b, a) (where a, b is a natural number); and a signal produced by NRZI-converting an RLL (1, 7)-encoded signal and then PR-equalizing the resultant signal.

Figure 2:
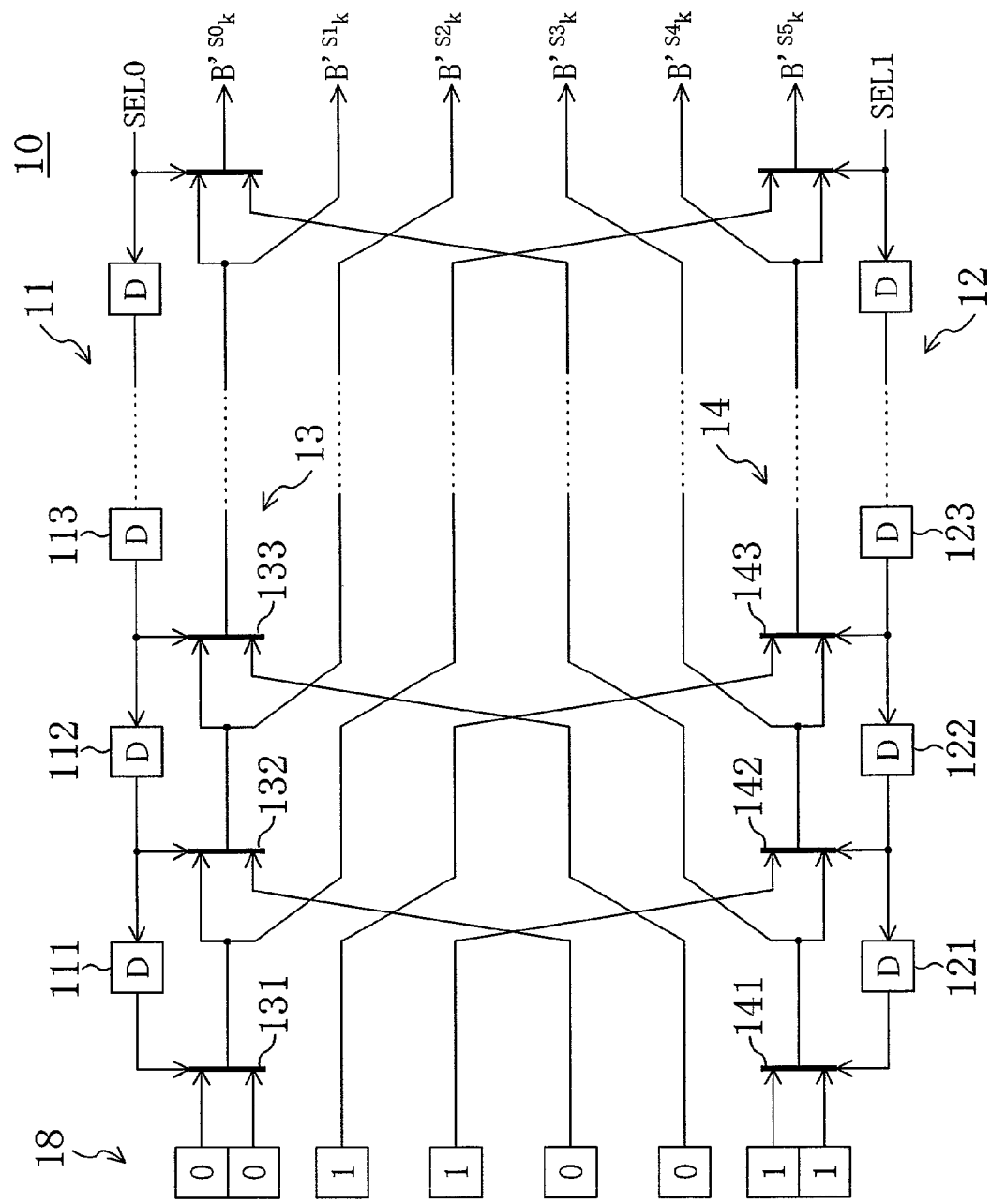
FIG. 2 shows a first example of a path-select-signal memory section in FIG. 1.

FIG. 2 shows a first example of the path-select-signal memory section in FIG. 1. The path-select-signal memory section 10 of FIG. 2 includes first and second shift registers 11, 12, first and second selector trains 13, 14 each formed from a plurality of selectors, and a binary output unit 18.

The first and second shift registers 11, 12 receive path select signals SEL0, SEL1 from the ACS operation section 51, respectively. The values stored in resisters 111, 112, . . . of the first shift register 11 are respectively applied to selectors 131, 132, of the first selector train 13 as select signals. Similarly, the values stored in resisters 121, 122, . . . of the second shift register 12 are respectively applied to selectors 141, 142, . . . of the second selector train 14 as select signals. The binary output unit 18 outputs the values of the decoded bits corresponding to the branches that occurred a prescribed time ago in the surviving paths to the respective states.

Figure 9:
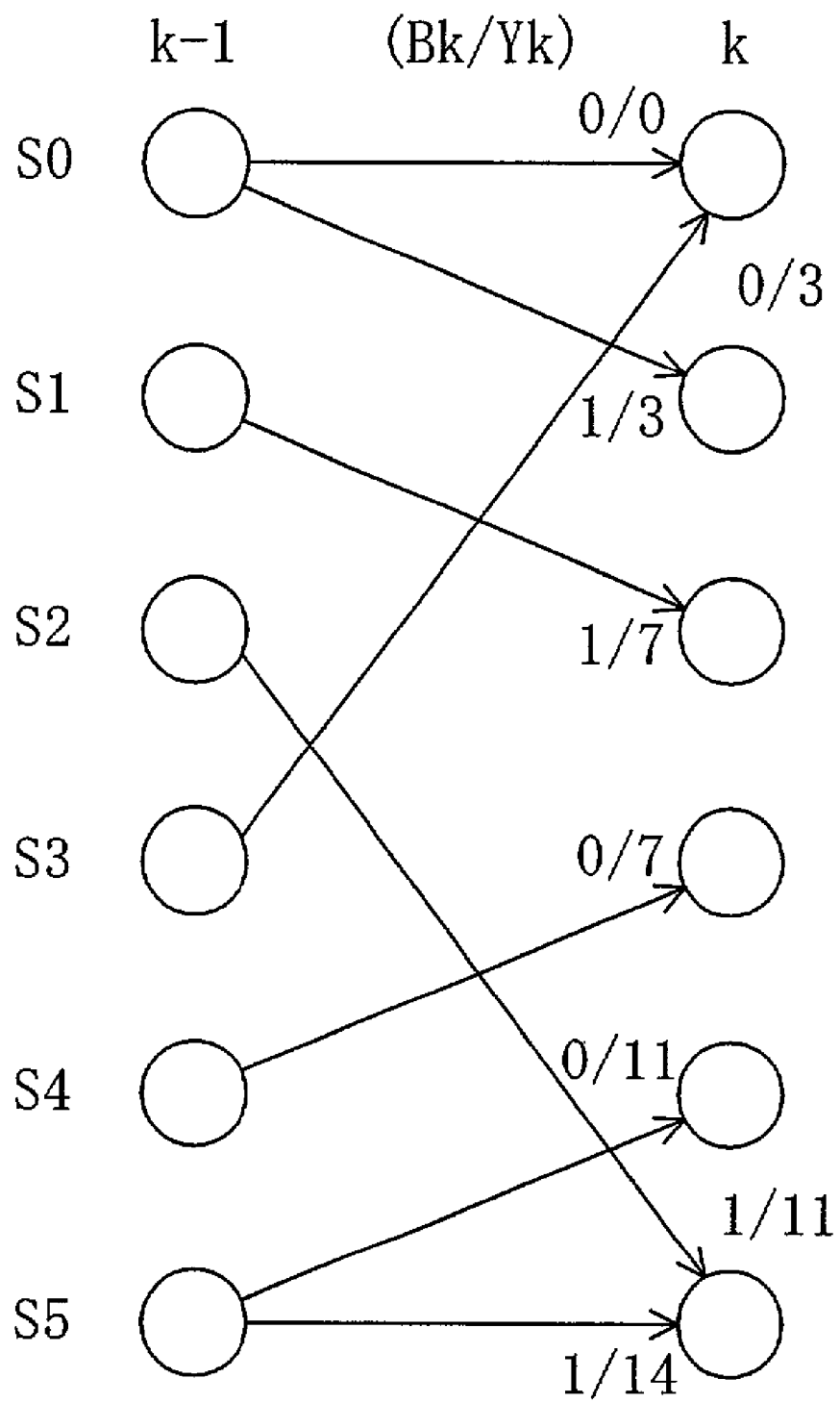
FIG. 9 is a trellis diagram based on the state transition of the Viterbi detector in FIG. 8.

Output signal lines of the binary output unit 18 and the first and second selector trains 13, 14 are connected in the same manner as that of the trellis diagrams of FIGS. 9, 12 and 13. Decoded bits $B'^{Si}_k$ (where i is 0 to 5) that were obtained a prescribed time ago in the surviving paths to the respective states are output from the last column of the connection.

It should be noted that there are only two path select signals although there are six states. This is because of the run length limitation for encoding operation and the PR equalization method. The path-select-signal memory of the present invention stores only the path select signals in the registers rather than storing the decoded bits corresponding to the surviving paths to the respective states in the registers.

The conventional path memory 52 stores all the bit strings from past to present in the registers in order to decode the bit $B'^{Si}_k$ (where i is 0 to 5) that was obtained a prescribed time ago in a surviving path to each state. The path memory 52 therefore includes a vast number of registers. However, the path-select-signal memory section 10 of the present embodiment stores only the path select signals in the registers of the first and second shift registers 11, 12. This enables significant reduction in the number of registers. In general, the registers consume a larger amount of power and occupy a larger area as compared to the normal logic circuitry. Such reduction in the number of registers therefore greatly contributes to reduction in power consumption and area. The present embodiment thus enables implementation of a low-power, small-area Viterbi detector.

Figure 3:
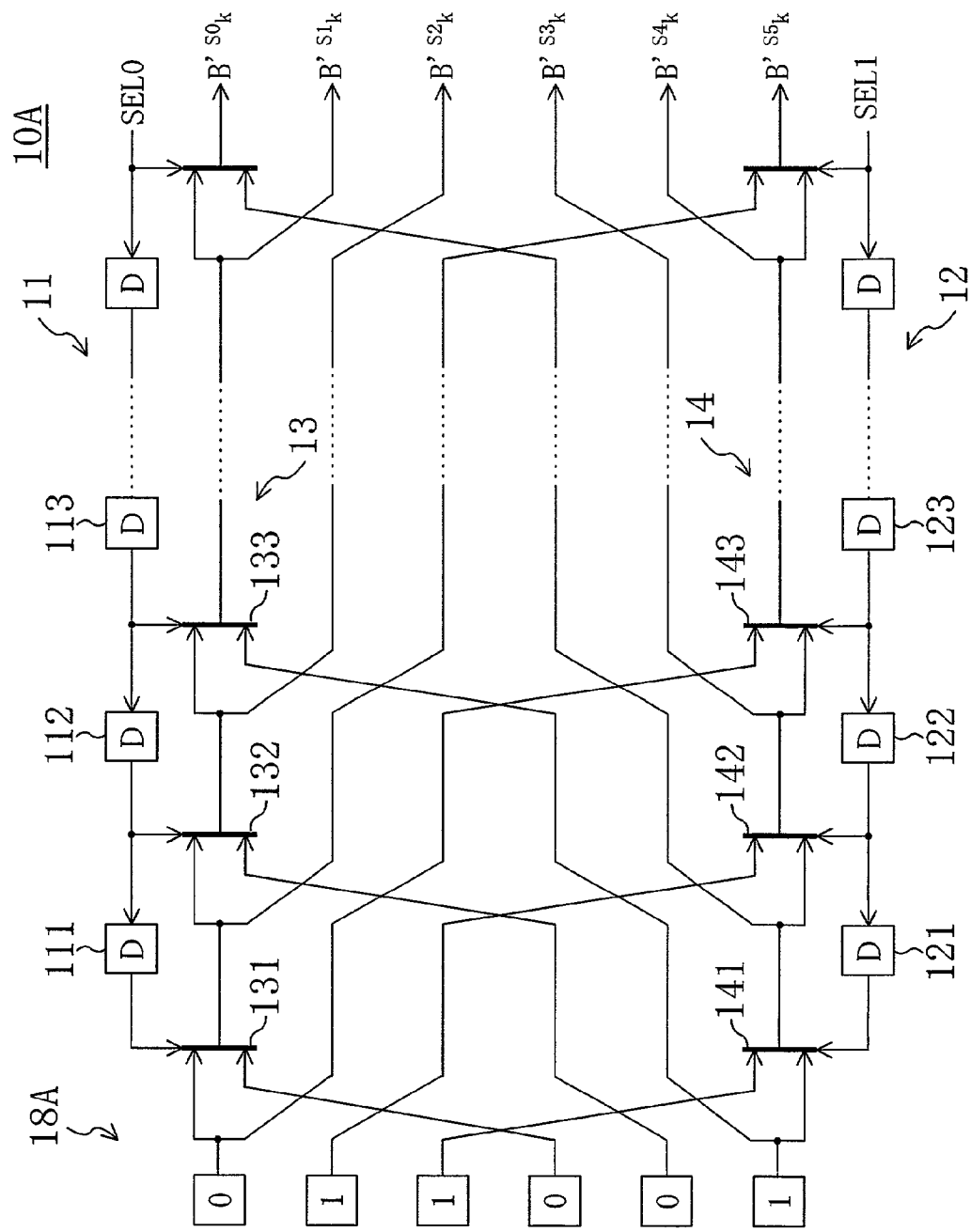
FIG. 3 shows a second example of the path-select-signal memory section in FIG. 1.

FIG. 3 shows a second example of the path-select-signal memory section in FIG. 1. The path-select-signal memory section 10A of FIG. 3 has approximately the same structure as that of FIG. 2 except that the number of registers in a binary output unit 18A is smaller than that of the binary output unit 18 of FIG. 2 by two.

As can be seen from FIG. 2, both inputs of the first selector 131 in the first selector train 13 are "0", and the selector 131 always selects "0" for output regardless of the value of the path select signal SEL0 stored in the register 111 of the first shift register 11. Moreover, both inputs of the first selector 141 in the second selector train 14 are "1", and the selector 141 always selects "1" for output regardless of the value of the path select signal SEL1 stored in the register 121 of the second shift register 12. Accordingly, the number of registers can be reduced by two as in the binary output unit 18A shown in FIG. 3.

Figure 4:
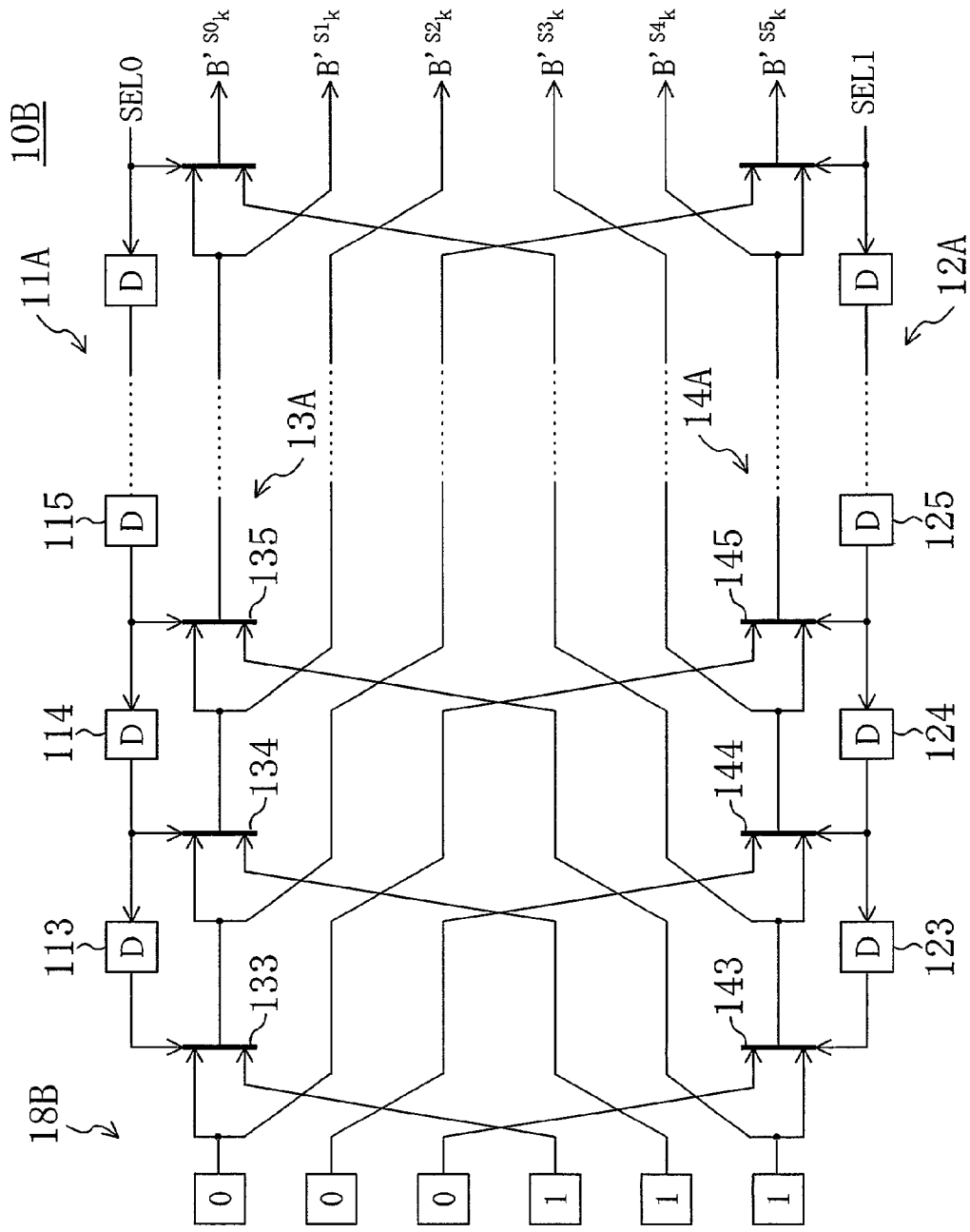
FIG. 4 shows a third example of the path-select-signal memory section in FIG. 1.

FIG. 4 shows a third example of the path-select-signal memory section in FIG. 1. The path-select-signal memory section 10B of FIG. 4 is different from that of FIG. 3 in that the number of registers in each of first and second shift registers 11A, 11B is reduced by two, and the number of selectors in each of first and second selector trains 13A, 14A is reduced by two.

In the structure of FIG. 3, the first two selectors 131, 132 of the first selector train 13 always output "0" regardless of the value of the select signal. Similarly, the first two selectors 141, 142 of the second selector train 14 always output "1" regardless of the value of the select signal. Accordingly, these four selectors 131, 132, 141, 142 and four registers 111, 112, 121, 122 for supplying a select signal to these selectors can be eliminated.

The structure of FIG. 4 corresponds to the structure of FIG. 3 having the above four selectors and four registers eliminated therefrom. Note that the values stored in a binary output unit 18B are changed according to such elimination of the selectors and registers. In the structure of FIG. 4, four selectors and six registers are eliminated from the structure of FIG. 2, enabling further reduction in power consumption and area. Note that the structures of FIGS. 2, 3, 4 have equal encoding capability.

Figure 5:
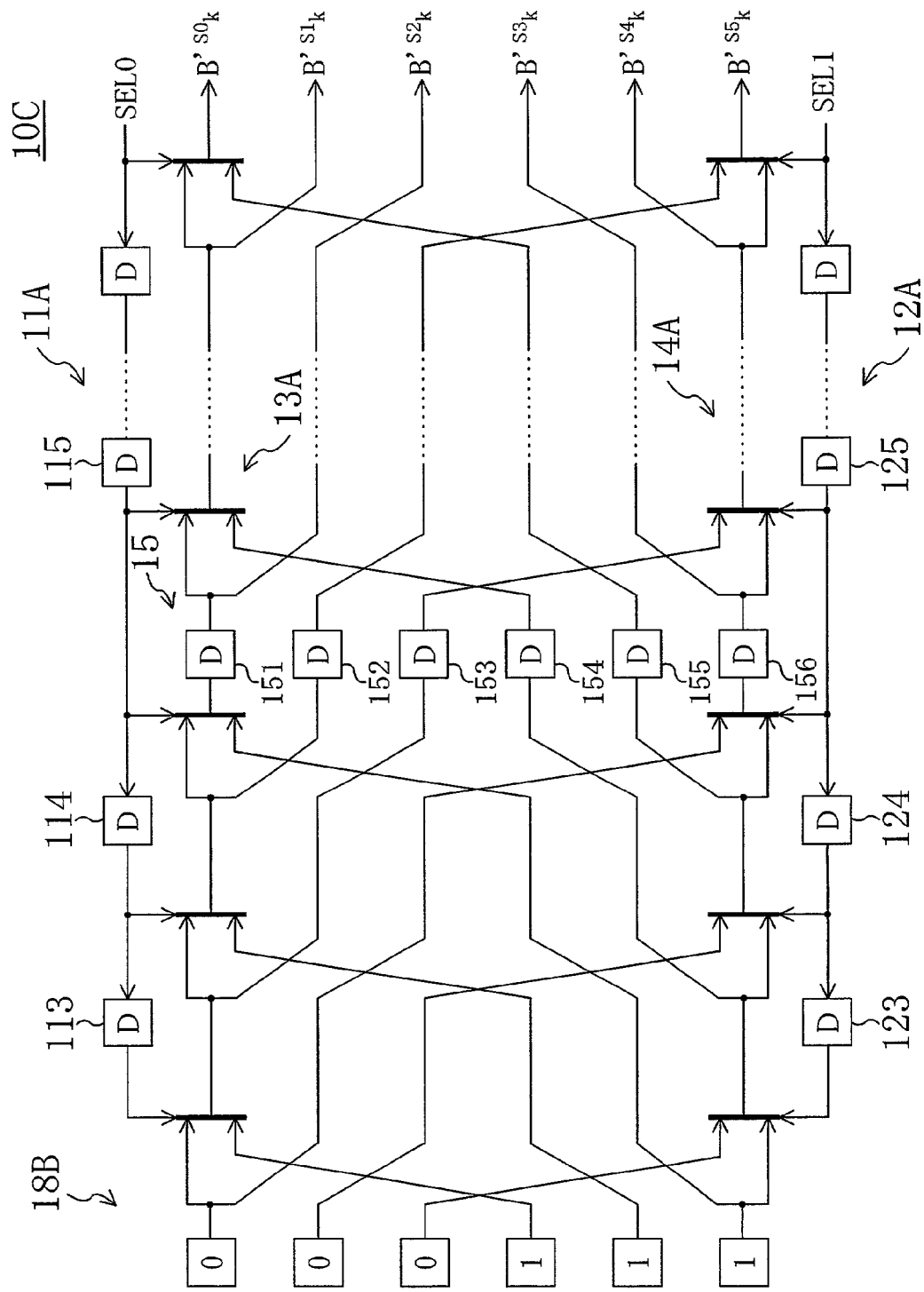
FIG. 5 shows a fourth example of the path-select-signal memory section in FIG. 1.
Figure 6:
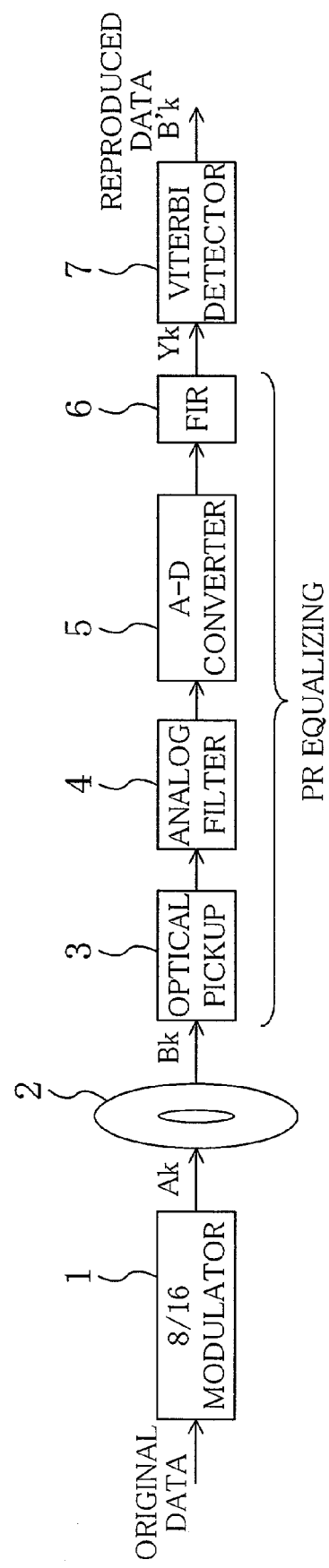
FIG. 6 schematically shows a PRML-based DVD recording/reproducing system.
Figure 7:
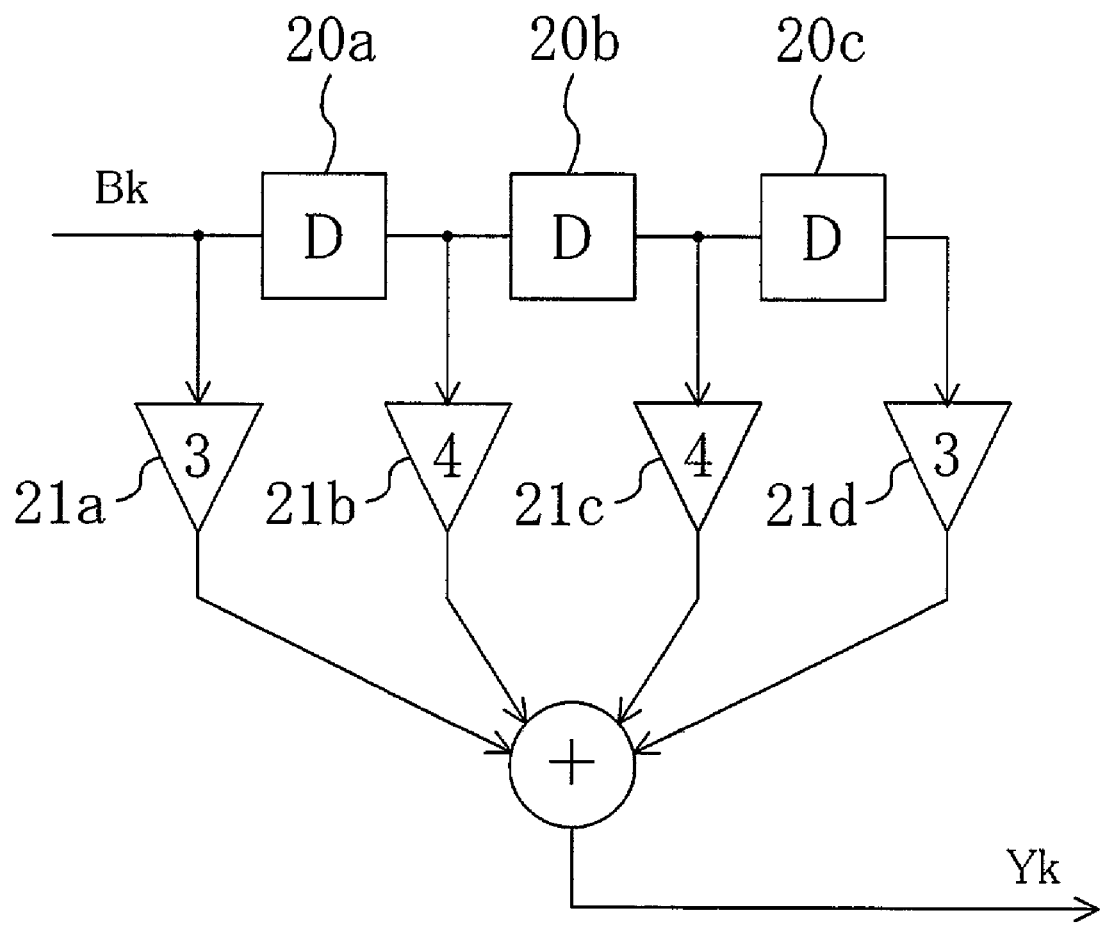
FIG. 7 shows the structure of an encoder for implementing convolutional encoding operation that corresponds to a process of obtaining a digital filter output from a channel bit pulse train recorded on a disk in the system of FIG. 6.

FIG. 5 shows a fourth example of the path-select-signal memory section in FIG. 1. The path-select-signal memory section 10C in FIG. 5 additionally includes a register train 15 formed from a plurality of registers 151 to 156 for pipeline processing.

If a clock frequency for operating the circuitry is increased in the structure of FIG. 2, 3 or 4, operation in the selectors may not be completed within one clock cycle. For example, if each shift register 11A, 11B of FIG. 4 has twenty stages, the output ("0", "1") of the binary output unit 18B would pass through twenty selectors in the worst case before a decoded bit $B'^{Si}_k$ (where i=0 to 5) is output. For example, provided that the clock frequency is 500 MHz (period: 2 ns) and the processing time of the selector is 0.2 ns, processing of the selectors cannot be completed within one clock cycle. As a result, the decoded bit $B'^{Si}_k$ may possibly be different from an expected value.

It is therefore required to provide the register train 15 between the selectors connected according to the trellis diagram so that the processing of the selectors can be completed within one clock cycle. This is so-called pipeline processing.

Note that the maximum-likelihood determination section 53 of the present embodiment compares the present path metrics in the respective states with each other, and outputs a tentative decoded bit of the state corresponding to the smallest path metric as the most likely decoded data B'k of the Viterbi detector. It should be understood that the most likely decoded data may be determined and output according to the majority logic. Alternatively, any one of the decoded data may be selected for output as the most likely decoded data.

As has been described above, the present invention enables the Viterbi detector to have a simplified circuit structure, allowing for reduction in power consumption and area.

What is claimed is:

1. A Viterbi detector for maximum-likelihood decoding of a convolutionally-encoded input signal, comprising:
   a branch metric calculating section for calculating branch metrics from the convolutionally-encoded input signal;
   an ACS (Add-Compare-Select) operation section for calculating a path metric for each state at a present time using both a path metric of a previous time in a surviving path of that state and a corresponding branch metric calculated by the branch metric calculating section, and outputting a path select signal corresponding to a metric selected by the ACS operation;
   a path-select-signal memory section responsive to the path select signal, for outputting, at a present time, decoded data in a surviving path having a prescribed constraint length, wherein the data are decoded at a corresponding branch a prescribed time ago; and
   a maximum-likelihood determination section for determining most likely decoded data from each decoded data received from the path-select-signal memory section, wherein
   the path-select-signal memory section includes
   a shift register for storing the path select signals in order of time,
   a selector train formed by a plurality of selectors for receiving values stored in respective cells of the shift register as a select signal, and
   a binary output unit for outputting a decoded bit corresponding to a branch that is decoded a prescribed time ago in the surviving path.

2. The Viterbi detector according to claim 1, wherein the maximum-likelihood determination section determines most likely decoded data from each of the decoded data according to majority logic, and outputs the most likely decoded data.

3. The Viterbi detector according to claim 1, wherein the maximum-likelihood determination section selects any one of the decoded data for output as most likely data.

4. The Viterbi detector according to claim 1, wherein the path-select-signal memory section includes a register train formed from a plurality of registers for pipeline processing.

5. The Viterbi detector according to claim 1, wherein the convolutionally-encoded input signal is produced from data whose shortest pulse width is limited to a value equal to or larger than two channel bits.

6. The Viterbi detector according to claim 1, wherein the convolutionally-encoded input signal is produced by equalizing data whose shortest pulse width is limited to a value equal to or larger than two channel bits by a PR (Partial Response) method.

7. The Viterbi detector according to claim 1, wherein the convolutionally-encoded input signal is produced by NRZI (Non Return to Zero Inverted)-converting an RLL (Run Length Limited) (2, 10)-encoded signal and then equalizing the resultant signal by a PR method.

8. The Viterbi detector according to claim 1, wherein the convolutionally-encoded input signal is produced by NRZI-converting an RLL (1, 7)-encoded signal and then equalizing the resultant signal by a PR method.

9. The Viterbi detector according to claim 1, wherein the Viterbi detector is used in a magnetic disk reproducing device.

10. The Viterbi detector according to claim 1, wherein the Viterbi detector is used in an optical disk reproducing device.

11. The Viterbi detector according to claim 1, wherein output signal lines of the binary output unit and the selector train are connected according to a trellis diagram that corresponds to encoding operation of the convolutionally-encoded input signal.

12. The Viterbi detector according to claim 1, wherein said plurality of selectors are directly connected to one another according to a trellis diagram.

* * * * *